United States Patent
Soer et al.

(10) Patent No.: US 7,839,482 B2
(45) Date of Patent: Nov. 23, 2010

(54) ASSEMBLY COMPRISING A RADIATION SOURCE, A REFLECTOR AND A CONTAMINANT BARRIER

(75) Inventors: Wouter Anthon Soer, Nijmegen (NL); Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 203 days.

(21) Appl. No.: 11/802,258

(22) Filed: May 21, 2007

(65) Prior Publication Data

US 2008/0291406 A1 Nov. 27, 2008

(51) Int. Cl.
*G03B 27/52* (2006.01)
*G03B 27/54* (2006.01)
*G03B 27/72* (2006.01)

(52) U.S. Cl. .............................. 355/30; 355/67; 355/71

(58) Field of Classification Search ... 250/492.1–492.3, 250/504 R, 370.08, 370.09, 372, 365; 355/53, 355/67, 30, 71; 378/34, 35
See application file for complete search history.

(56) References Cited

U.S. PATENT DOCUMENTS

| 7,332,731 | B2 * | 2/2008 | Klunder et al. ................. 355/53 |
| 2004/0257546 | A1 * | 12/2004 | Banine ......................... 355/53 |
| 2005/0077483 | A1 * | 4/2005 | Bakker et al. ............. 250/492.1 |
| 2006/0261290 | A1 | 11/2006 | Van Herpen et al. |
| 2007/0023711 | A1 * | 2/2007 | Fomenkov et al. ....... 250/504 R |
| 2007/0115445 | A1 * | 5/2007 | Box et al. ........................ 355/30 |
| 2008/0142741 | A1 * | 6/2008 | Van Herpen et al. ... 250/492.22 |
| 2008/0157006 | A1 * | 7/2008 | Van Herpen et al. ..... 250/492.2 |
| 2008/0225245 | A1 * | 9/2008 | Wood et al. .................... 355/30 |
| 2008/0231820 | A1 * | 9/2008 | Wassink ....................... 355/30 |

FOREIGN PATENT DOCUMENTS

| EP | 1211918 | * | 5/2002 |
| EP | 1274287 | * | 8/2003 |

* cited by examiner

*Primary Examiner*—Peter B Kim
(74) *Attorney, Agent, or Firm*—Pillsbury Winthrop Shaw Pittman LLP (57) ABSTRACT

An assembly including a radiation reflector and a contaminant barrier is disclosed. The contaminant barrier is arranged to receive radiation from a radiation source and to reflect that radiation towards the radiation reflector, and the radiation reflector is arranged to reflect the radiation, received from the contaminant barrier, back towards the contaminant barrier.

16 Claims, 8 Drawing Sheets

ASSEMBLY COMPRISING A RADIATION SOURCE, A REFLECTOR AND A CONTAMINANT BARRIER

FIELD

The present invention relates to an assembly comprising a radiation source, a reflector and a contaminant barrier.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

United States patent application publication US2006/0261290A1 discloses a radiation system configured to provide a projection beam of radiation in a lithographic apparatus. In an embodiment, the radiation system includes an EUV (Extreme Ultraviolet) source configured to provide EUV radiation, and a contaminant barrier that includes a plurality of foils arranged to trap contaminant material coming from the EUV source. In an embodiment, the foils are arranged in an optically closed arrangement so that at least one of the foils reflects EUV radiation passing the contaminant barrier at least one time.

SUMMARY

It is desirable to provide an improved assembly comprising a radiation source, a radiation reflector and contaminant barrier. Particularly, it is desirable to provide, for example, such an assembly that can provide improved properties to providing radiation to be used in EUV lithography.

According to an aspect of the invention, there is provided an assembly
  a radiation reflector; and
  a contaminant barrier,
wherein the contaminant barrier is arranged to receive radiation from a radiation source and to reflect that radiation towards the radiation reflector, and
  the radiation reflector is arranged to reflect the radiation, received from the contaminant barrier, back towards the contaminant barrier.

According to an aspect, there is provided an assembly comprising a radiation source configured to emit radiation, a normal incidence collector arranged to reflect the radiation, and a contaminant barrier configured to reflect the radiation during operation.

According to an aspect, there is provided a lithographic projection apparatus comprising an assembly according to an embodiment of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
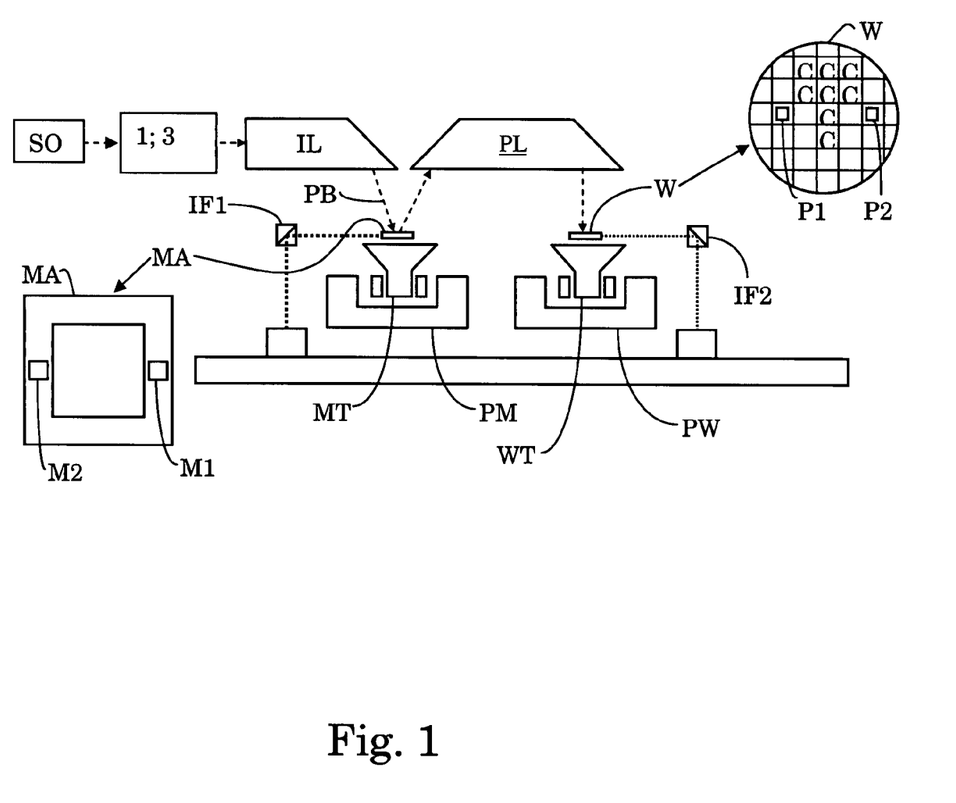
FIG. 1 depicts a lithographic apparatus according to an embodiment of the invention.

FIG. 1 schematically depicts a lithographic apparatus according to one embodiment of the invention. The apparatus can comprise:
  a radiation source SO configured to provide radiation;
  an assembly comprising a radiation collector 1 and contaminant barrier 3;
  an illumination system (illuminator) IL configured to condition a radiation beam PB (e.g. UV radiation and particularly EUV radiation);
  a support structure (e.g. a mask table) MT constructed to support a patterning device (e.g. a mask) MA and connected to a first positioner PM configured to accurately position the patterning device MA in accordance with certain parameters;
  a substrate table (e.g. a wafer table) WT constructed to hold a substrate (e.g. a resist coated wafer) W and connected to a second positioner PW configured to accurately position the substrate W in accordance with certain parameters; and
  a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the contaminant barrier 3 may be configured to trap contaminants emanating from the source SO. For example, the contaminant barrier 3 may be configured to provide a contaminant barrier between the source SO and a downstream part of the apparatus. Also, for example, the radiation beam may be provided by the collector 1 that receives the radiation from the source SO. The illuminator IL may receive the radiation from a radiation source SO, via the collector 1. Advantageous embodiments of the assembly of the collector 1 and contaminant barrier 3 will be explained below, with reference to FIGS. 4-11.

The source SO may be configured in various ways. For example, the source SO may be a discharge-produced plasma source (DPP source), a laser-produced plasma source (LPP source), for example a known tin or Xe source, or a different radiation source.

The source and the lithographic apparatus may be separate entities, for example when the source is an excimer laser. In such cases, the source is not considered to form part of the lithographic apparatus and the radiation is passed from the source SO to the illuminator IL with the aid of the collector 1, and/or for example a beam delivery system comprising, for example, suitable directing mirrors and/or a beam expander. In other cases the source may be an integral part of the lithographic apparatus, for example when the source is a mercury lamp. The source SO and the illuminator IL, together with the collector 1, contaminant barrier 3 and/or beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser. The illuminator may be used to condition the radiation beam, to have a desired uniformity and intensity distribution in its cross section.

The radiation beam PB is incident on the patterning device (e.g., mask) MA, which is held on the support structure (e.g., mask table) MT, and is patterned by the patterning device. Having traversed the patterning device MA, the radiation beam PB passes through the projection system PL, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam PB. Similarly, the first positioner PM and another position sensor IF1 can be used to accurately position the patterning device MA with respect to the path of the radiation beam, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
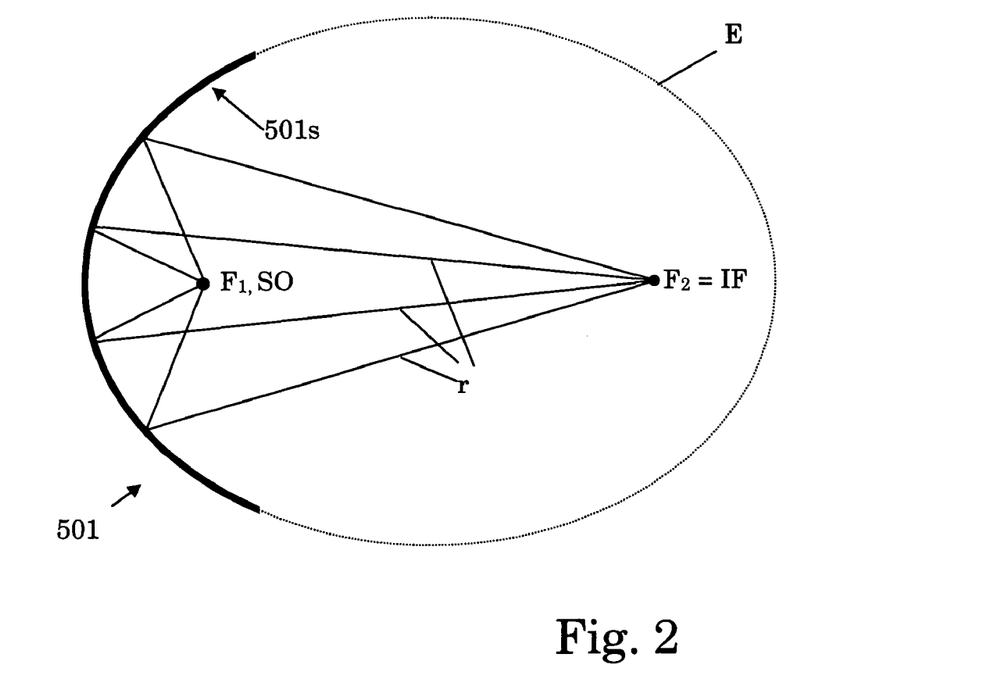
FIG. 2 schematically depicts an embodiment of a first prior art collector.

FIG. 2 shows an embodiment, in cross-section, of a radiation reflector 501. The reflector is a radiation collector of elliptical configuration, having two natural ellipse focus points F1, F2. Particularly, the normal incidence collector comprises a collector having a single radiation collecting surface 501s having the geometry of the section of an ellipsoid. In other words, the ellipsoid radiation collecting surface 501s section extends along a virtual ellipsoid (part of which is depicted as dotted line E in FIG. 2).

Where the collector 501 is ellipsoidal (i.e., comprising a reflection surface 501s that extends along an ellipsoid), it focuses radiation from one focal point F1 into another focal point F2. The focal points are located on the long axis of the ellipsoid at a distance $f=(a2-b2)^{1/2}$ from the center of the ellipse, where a2 and b2 are the lengths of the major and minor axes, respectively. In the case that the embodiment shown in FIG. 1 comprises an LPP radiation source SO, the collector 1 is desirably a single ellipsoidal mirror as shown in FIG. 2, where the radiation source SO is positioned in one focal point (F1) and an intermediate focus IF is established in the other focal point (F2) of the mirror. Radiation emanating from the radiation source, located in the first focal point F1 towards the reflecting surface 501s and the reflected radiation, reflected by that surface towards the second focus point F2, is depicted by lines r in FIG. 2. For example, according to an embodiment, a mentioned intermediate focus IF can be located between the collector 1 and an illumination system IL (see FIG. 1) of a lithographic apparatus, or be located in the illumination system IL, if desired.

Figure 3:
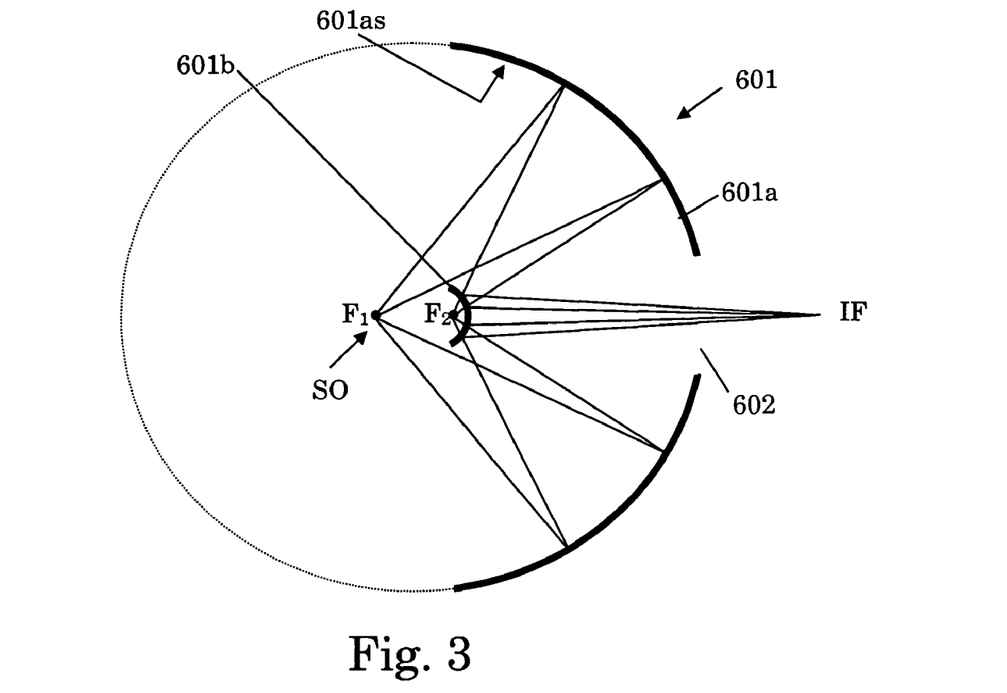
FIG. 3 schematically depicts an embodiment of a second prior art collector.

FIG. 3 schematically shows another embodiment, in cross-section, of a radiation reflector 601. In this case, the reflector comprises two normal incidence collector parts 601a, 601b, each part 601a, 601b desirably (but not necessarily) having a substantially ellipsoid radiation collecting surface section. Particularly, the FIG. 3 embodiment comprises a Schwarzschild collector design, desirably consisting of two mirrors 601a, 601b. The source SO can be located in a first focal point F1. For example, the first collector mirror part 601a can have a concave reflecting surface (for example of ellipsoid or parabolic shape) 601 as that is configured to focus radiation emanating from the first focal point F1 towards the second collector mirror part 601b, particularly towards a second focus point F2. The second mirror part 601b can be configured to focus the radiation that is directed by the first mirror part 601a towards the second focus point F2, towards a further focus point IF (for example an intermediate focus). The first mirror part 601a comprises an aperture 602 via which the radiation (reflected by the second mirror 601b) can be transmitted towards the further focus point IF. For example, the embodiment of FIG. 3 can advantageously be used in combination with a DPP radiation source.

FIGS. 4-11 relate to various advantageous embodiments of assemblies 1, 3 comprising a radiation reflector 1 and a contaminant barrier 3 and may include a radiation source SO. For example, advantageously, the assembly 1, 3 can be part of an above-described lithographic apparatus (as shown in FIG. 1). The assemblies can provide improved properties to providing radiation, particularly (but not necessarily) to be used in EUV lithography. Particularly, the contaminant barrier 3 can be arranged to receive radiation (for example, EUV radiation) emitted from a source SO, and to reflect that radiation towards the radiation reflector 1. Desirably, according to an embodiment, the radiation reflector 1 is arranged to reflect the radiation, received from the contaminant barrier 3, back towards the contaminant barrier 3.

The radiation reflector of the assembly can be configured in various ways. According to an embodiment, the radiation reflector is a normal incidence radiation collector 1.

Figure 4:
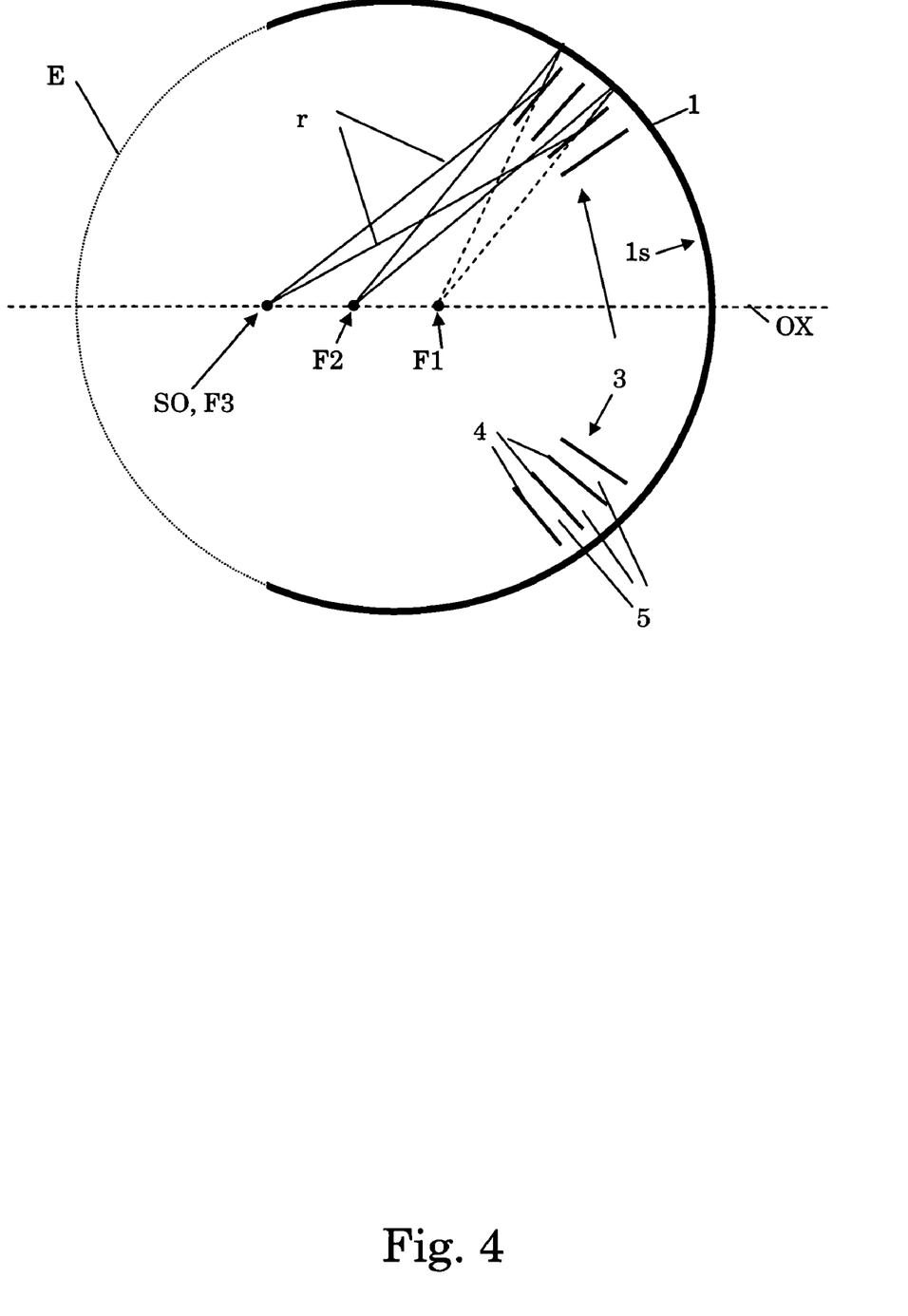
FIG. 4 depicts part of an assembly according to first embodiment of the invention.

For example, FIG. 4 shows an embodiment of an assembly, comprising a normal incidence radiation reflector being a collector 1 having a single substantially ellipsoid radiation collecting surface section.

According to an embodiment, there may be provided an assembly comprising a normal incidence Schwarzschild collector (see for example FIG. 3) having two radiation collecting surfaces, in combination with a suitable contaminant barrier (for example similar to the contaminant barrier 3 shown in FIG. 4).

In each of those cases, the normal incidence radiation collector 1 is desirably arranged to reflect the radiation, received from the contaminant barrier 3, back towards the contaminant barrier 3.

According to an embodiment, the contaminant barrier 3 is arranged to optically block all lines of sight between a reflecting surface of the collector 1 and the radiation source SO. For example, the contaminant barrier may provide an optically closed arrangement between source SO and the collector 1.

Figure 5:
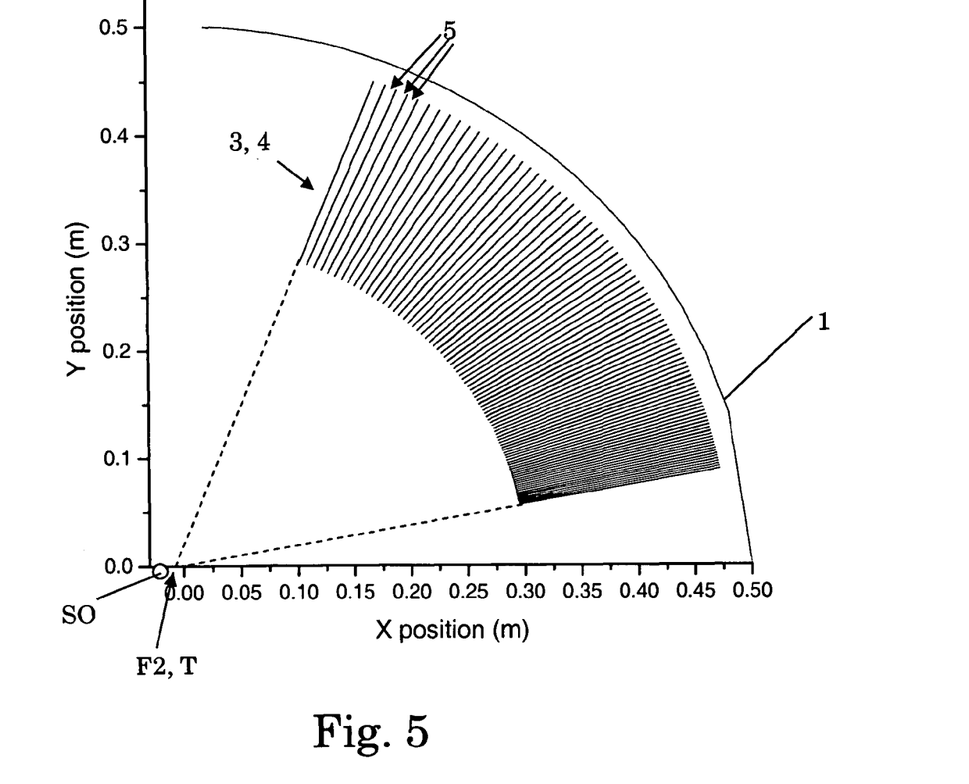
FIG. 5 depicts part of an assembly according to a second embodiment of the invention.
Figure 6:
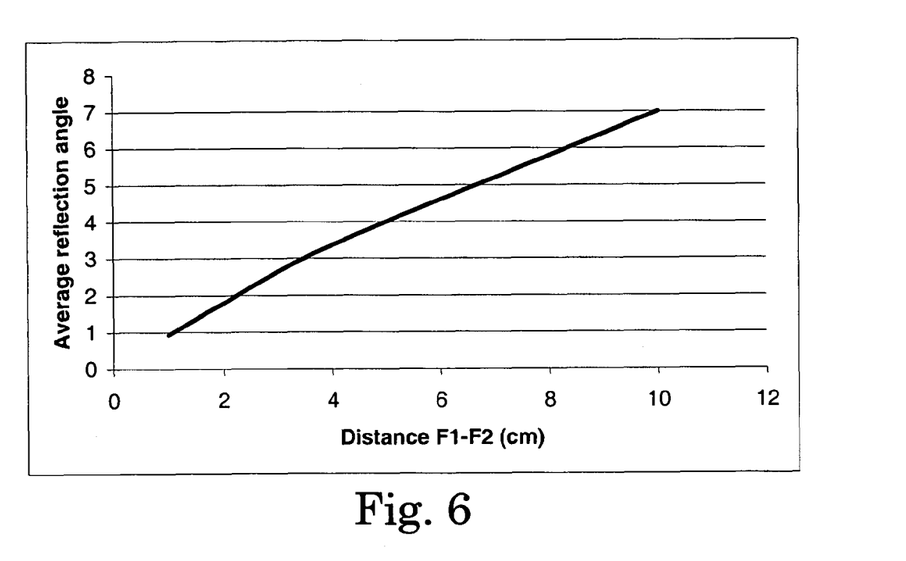
FIG. 6 is a graph showing an average reflection angle as function of a distance between focal points F1 and F2 of an example of the invention.

Desirably, the configuration is such that radiation, emanating from the source SO, passes the contaminant barrier 3 twice, and is reflected by the contaminant barrier 3 at least once. FIGS. 4-6 relate to embodiments where radiation is reflected only once by the contaminant barrier 3 (when passing the contaminant barrier in a direction from the source towards the collector surface).

Figure 7:
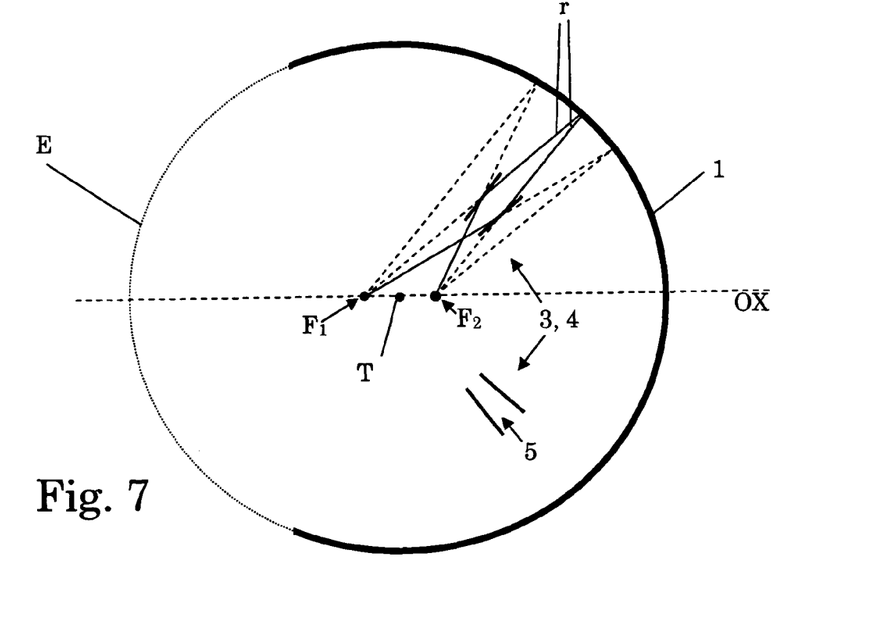
FIG. 7 shows part of an assembly according to a third embodiment of the invention.
Figure 8:
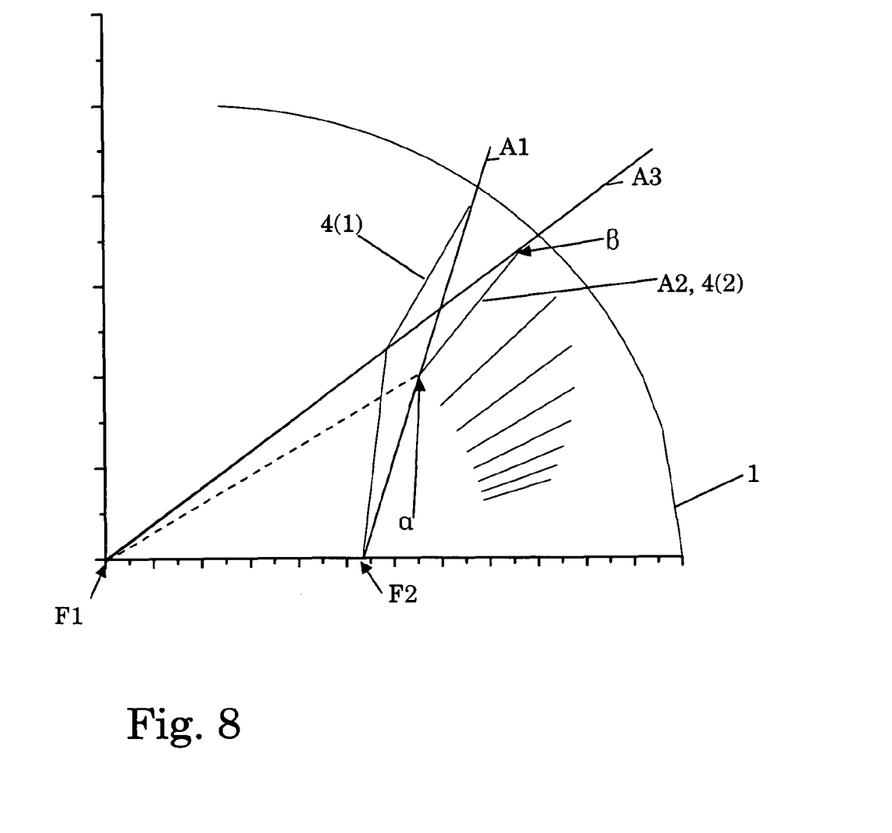
FIG. 8 shows a sequence of steps for placing the foils, to provide an assembly according to a fourth embodiment of the invention.
Figure 9:
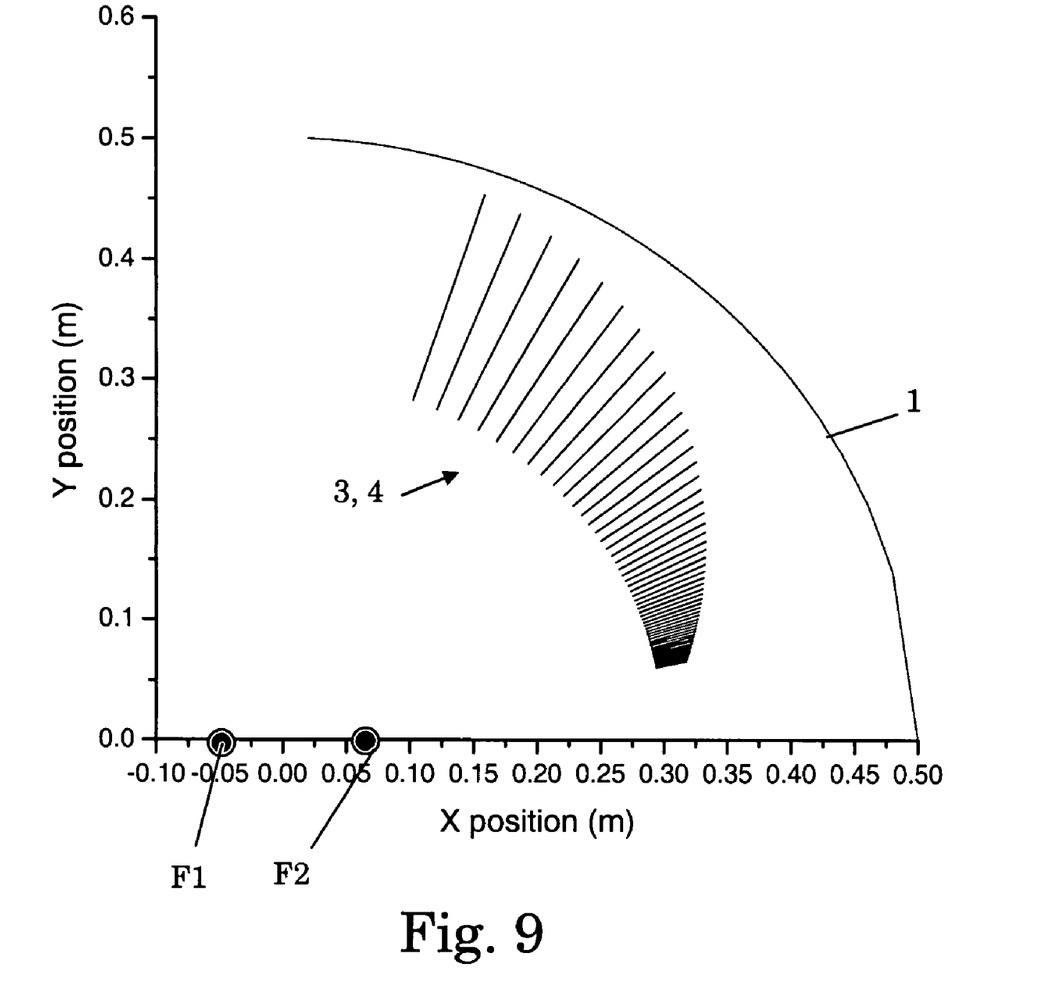
FIG. 9 shows part of an assembly according to a further embodiment of the invention.

FIGS. 7-9 relate to dual-reflection embodiments wherein radiation is reflected by the contaminant barrier 3 when passing the contaminant barrier in both directions.

As follows from FIGS. 4, 5 and 7-9, the contaminant barrier may comprise a plurality of radiation reflecting elements 4 (also called foils). An example of a radiation reflecting element 4 (or foil) of the contaminant barrier 3 is depicted in more detail in FIGS. 10A, 10B. These elements 4 can be configured and shaped in various ways, and comprise various materials, as will be appreciated by the skilled person. For example, each element 4 can be provided with or be composed of an optically reflective layer to reflect incoming radiation and to block or capture incoming debris particles. For example, tin can be used as a reflective material in case the source is a tin source (see below). More generally, the reflecting elements 4 desirably have material properties matching contaminant materials in order to absorb these materials. In an embodiment, a standard type of foils 4 may be used, such as molybdenum foils 4, or foils of a different material.

For example, the radiation reflecting elements 4 may be arranged to provide a contaminant barrier, and may include a plurality of foils 4 to trap contaminant material coming from the radiation source. Desirably, as follows from the above, the foils 4 may be arranged in an optically closed arrangement so that the foils 4 reflect radiation passing the contaminant barrier at least one time. By the closed arrangement, fast debris traveling in straight lines can be trapped by the foils 4.

In an embodiment, a buffer gas may be injected in or near the contaminant barrier, particularly in order to further thermalize atomic debris that has a random velocity component, which improves the suppression of this debris by the contaminant barrier.

Figure 10A:
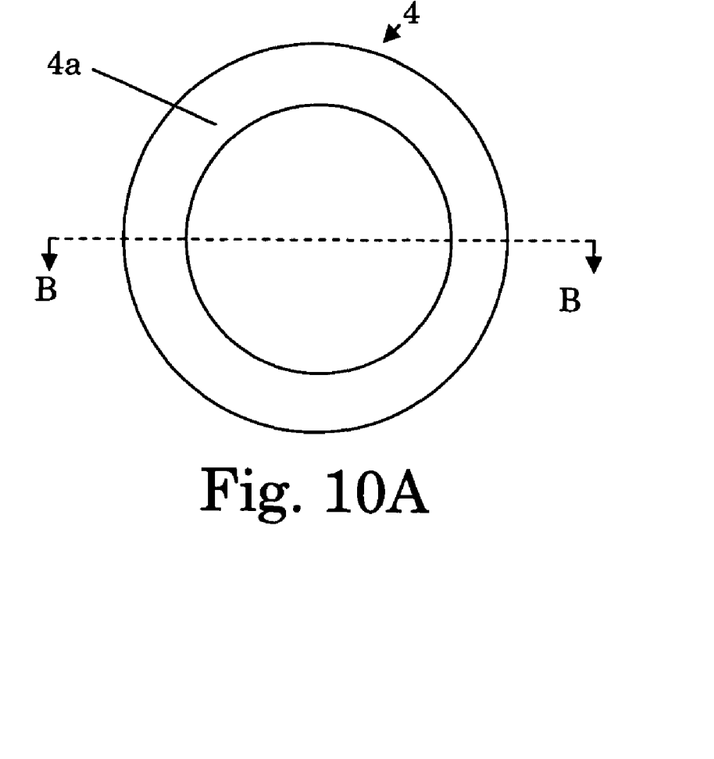
FIG. 10A shows a front view of an example of part of a contaminant barrier.
Figure 10B:
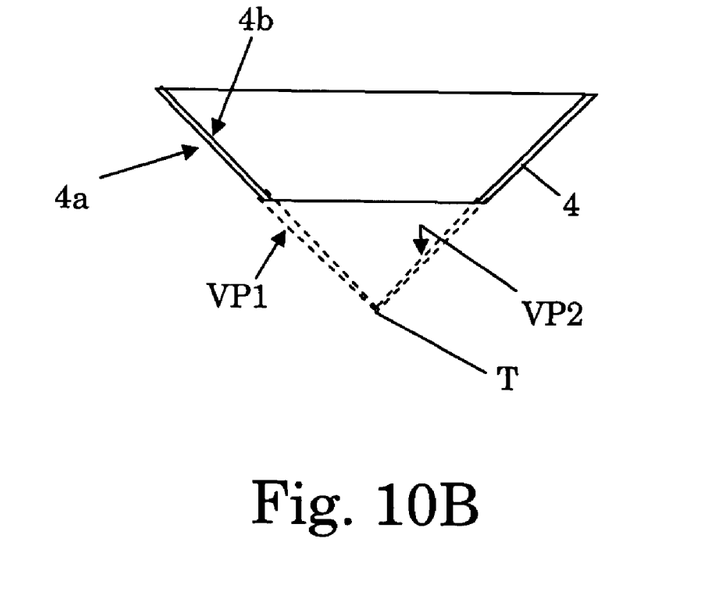
FIG. 10B shows a cross-section over line B-B of FIG. 10*a*.

According to an embodiment, the contaminant barrier 3 comprises a plurality of radiation reflecting elements 4, wherein each of the radiation reflecting elements 4 comprises at least one reflecting surface 4a, 4b to reflect the radiation (see FIG. 10). For example, the contaminant barrier 3 is desirably configured to reflect incoming radiation by grazing incidence reflection.

Radiation is permitted to pass the contaminant barrier 3 via reflection of the foils. Desirably (as in the present embodiments), each of the radiation reflecting elements 4 has a rotationally symmetric geometry with respect to a common optical axis OX, particularly in the case that the collector 1 has a rotationally symmetric geometry with respect to the optical axis OX (for example in case of a normal incidence collector having one or more ellipsoid mirrors).

For example, referring to FIGS. 10A, 10B, each reflecting element 4 can be a frusco-conical ring-shaped element 4. Particularly, the radiation reflecting element 4 substantially extends along a respective virtual conical plane. In an embodiment, each element 4 has a radiation reflecting outer surface 4a (i.e., the outer surface 4a is configured to reflect the radiation that is emitted by the radiation source SO, particularly via grazing incidence reflection). Also, desirably, the outer surface 4a of the element 4 extends along a first virtual conical plane VP1 having an apex T. In an embodiment (see FIG. 7 below), an inner surface 4b of the reflecting element 4 is also adapted to reflect the radiation, desirably via grazing incidence reflection. Also, desirably, the inner surface 4b of the element 4 extends along a second virtual conical plane VP2 having an apex that desirably coincides with the apex T of the first virtual conical plane VP1 (see FIG. 10B).

In an embodiment, for example, the assembly can comprise a support structure (not shown for clarity) to hold the radiation reflecting elements 4 in desired positions. The support structure can be an integral part of these elements 4 and/or may comprise spokes, wires, distancing ribs, or other relatively narrow or thin connecting members to connect the radiation reflecting elements 4 to each other. Desirably, such connecting members extend transversely between the elements 4 (i.e., substantially perpendicular to a direction of radiation transmission through the contaminant barrier 3). Also, for example, the contaminant barrier 3 can be connected to the radiation reflector 1 in a suitable manner, to hold the contaminant barrier 3 in a desired position in front of a reflecting surface of the radiation reflector 1.

According to an embodiment, each of the radiation reflecting elements 4 may extend along a respective virtual conical plane having an above-mentioned apex T that substantially coincides with an optical axis OX of the assembly, particularly in the case that the collector comprises one or more ellipsoid mirror parts.

As an example, the radiation source SO may be configured to emit diverging radiation, see FIGS. 4, 7. In that case, the contaminant barrier 3 may be configured to change the divergence of the radiation. For example, the contaminant barrier 3 may be configured to further diverge (i.e. increase divergence of) the diverging radiation emitted by the source SO. The radiation collector 1 may be arranged to reflect that diverging radiation that emanates from the contaminant barrier 3 so as to provide converging radiation (desirably to focus the radiation onto an intermediate focus IF).

In an embodiment (see for example FIG. 7), the contaminant barrier 3 may be configured to reduce divergence (i.e. decrease divergence) of diverging radiation emitted by the source SO, and the collector 1 may be arranged to reflect the radiation (having decreased divergence) that emanates from the contaminant barrier 3, back towards the contaminant barrier 3.

In the embodiments of FIGS. 4 and 7, the collector 1 focuses the radiation, received from the contaminant barrier 3, onto a focal point F2 on an optical axis, wherein the focal point F2 is located between the source and the radiation reflector. In case of application of a Schwarzschild collector system (see FIG. 3), the collector 1 can be configured to focus the radiation, received from the contaminant barrier, onto a focal point IF on an optical axis, wherein the focal point F2 is located in an area that, viewed from the collector, is faced away from a source location.

For simplicity, FIG. 4 only depicts four of the frusco-conical elements 4 in cross-section, however, desirably, a much larger number of such elements 4 are provided. In the embodiment of FIG. 4, the contaminant barrier 3 provides a series of concentric conical surfaces, where the apex of each cone lies in one of the focal points (F2) of the collector 1. An advantage of this embodiment is that it uses a minimum number of reflections and therefore has a relatively low reflection loss. Particularly, in the embodiment according to FIG. 4, the reflecting surface 1s of the collector 1 reflects the radiation parts that are transmitted from the source SO to the focal point F2 once (i.e. back to the contaminant barrier 3). Also, the contaminant barrier 3 as such reflects the radiation only once, viewed along a radiation transmission path between source SO and a downstream collector focus point F2.

In the embodiment of FIG. 4, the radiation source SO is spaced-apart from a first (natural) focus point of the collector 1, and the contaminant barrier 3 is arranged to reflect radiation received from the source SO towards the collector 1 such that the collector 1 receives the radiation as appearing from a (natural) focus point F1.

Moreover, in the FIG. 4 embodiment, each of the radiation reflecting elements 4 desirably extends along a respective virtual conical plane having an above-mentioned apex T that substantially coincides with the optical axis OX of the assembly, the apex being located in the second (natural) focus point F2 of the collector 1. Also, in the FIG. 4 embodiment, the contaminant barrier 3 defines radiation transmission channels 5 (between the reflecting elements 4), wherein each radiation transmission channel 5 extends along a virtual transmission direction that includes an angle with a radiation reflection surface 1s of the radiation reflector of more than 45°.

For example, according to an embodiment, the radiation transmission channels 5 may have channel ends located near (faced towards) the radiation reflection surface 1s of the collector 1, wherein the distance between each channel end and the surface 1s of the radiation reflector 1 can be smaller than 10 cm. For example, the latter distance can be smaller than about 1 cm. According to an embodiment, a length of each radiation transmission channel 5 of the contaminant barrier 3, measured along a radiation transmission direction, may be smaller than half a distance between the respective channel and the radiation source, measured in the same direction. Moreover, a length of each radiation transmission channel 5 of the contaminant barrier 3, measured along a radiation transmission direction, may be larger than about a tenth of a distance between the respective channel and the radiation source, measured in the same direction. Moreover, the various transmission channels 5 (that can have frusco-conical shapes, for example) of the contaminant barrier 3 can have substantially the same transmission lengths, or can differ in length. Similarly, the distance between each channel end and the radiation reflector 1 can be about the same for all channels 5 (see for example FIG. 4), or can differ (see FIGS. 8 and 9) for different channels 5. Also, the radiation transmission channels 5 may be dimensioned and positioned differently.

Comparing FIG. 4 with FIG. 2, for radiation to be collected in the second focus point F2, the source SO should not be positioned in the first focus point F1 (as would be the case without the contaminant barrier 3, see FIG. 2), but in a new point F3. The position of the source location F3 is chosen such that upon reflection on outer surfaces 4b of the elements 4, the radiation appears to have originated at the first focal point F1, and is therefore properly focused to the second focal point F2. This can be achieved by taking the distance between F1 and F2 approximately equal to the distance between F1 and F3. Since the elements 4 are oriented towards F2, they will not reflect radiation that is focused by the collector 1 onto the second focus point F2, so that the radiation will pass through the passages 5 as if it were a "normal" contaminant barrier. In addition, notice that although the position of the source SO relative to the collector 1 is changed with respect to the FIG. 2 configuration, the focusing properties of the collector mirror 1 can remain unaffected in the present embodiment of FIG. 4.

Desirably, the length and spacing of the reflecting elements 4 of the contaminant barrier 3 are chosen such that the contaminant barrier 3 is optically closed as seen in the transmission directions from the source SO towards the collector 1. In some embodiments, the contaminant barrier 3 does not provide an optically closed configuration for positions close to the optical axis OX, for example in the case incident and reflected radiation paths overlap. An embodiment of an assembly comprising a Schwarzschild collector (see FIG. 3) can also provide an optically closed configuration for positions close to the optical axis OX, since in that case, no radiation has to be collected from around (near) the optical axis, and hence no debris mitigation is required there.

According to an embodiment, the radiation reflecting elements 4 are densely spaced with respect to each other, in order to minimize discretization errors, i.e. etendue spreading due to the fact that the orientation of subsequent elements 4 changes in discrete steps rather than continuously. The spreading can occur because an element 4 that is aligned with a given radiation path is slightly misaligned for any other radiation path. For the same reason, it is desirably to position the contaminant barrier 3 as a whole relatively far from the source SO. According to an embodiment, the contaminant barrier induced error may be compensated by reshaping the elements 4 to have a suitable convex reflective surface, such that the elements 4 undo or counteract the error.

The placement of the reflecting elements 4 may be found by following the following steps:

1) Choose a desired collection angle of the assembly, as well as a foil length (measured along the radiation transmission direction) and a desired contaminant barrier distance between an inner side of the contaminant barrier 3 and the source SO;

2) Place a first foil 4 by drawing a line originating from the point F2 (see FIG. 4) with the given collection angle. The first foil 4 is on this line and starts at the given contaminant barrier distance, and has the given foil length;

3) Next, draw a line from the point F3 (see FIG. 4) through the front of the previous foil 4. The end point of the next foil 4 is found at the intersection of this line with a circle of radius of the sum of the contaminant barrier distance and the foil length;

4) Now, draw a line from the mentioned end point towards F2 up to a second point, such that it has the given foil length; and 5) Draw subsequent foil positions by repeating steps 3 and 4.

By rotation of a resulting 2-dimensional sequence of foil positions around a common axis of rotation (particularly the above-mentioned optical axis OX), a 3-dimensional, rotationally symmetric contaminant barrier 3 can be designed.

An example of a realistic resulting embodiment is shown in FIG. 5, particularly showing densely spaced foil positions and orientations in a XY-plane. In FIG. 5, the common apex T to which the foils 4 are directed is located between the source and the coordinate X=−0.01 m and Y=0 m, and an above-mentioned focus point F1 of the collector coincides with coordinate X=−0.01 m, Y=0 m.

Particularly, in the embodiment of FIG. 5, the contaminant barrier 3 comprises an array of radiation reflecting elements 4 being spaced-apart from each other by predetermined intermediate spacings, wherein the intermediate spacing increased for each subsequent pair of adjoining radiation reflecting elements 4, viewed radially outwardly from an optical axis of the assembly.

In the example of FIG. 5, optimized foil positions are shown for a single reflective contaminant barrier (see FIG. 4) based on the following parameters: source position X=−0.02 m and Y=0 m, a maximum collection angle=70°, a minimum collection angle=10°, a foil thickness of each foil=100 µm, a starting foil length=18 cm, and a collector distance=50 cm.

Table 1 shows expected values for various contaminant barrier designs, using the parameters: foil thickness=100 µm, collector distance=50 cm. Angles are in provided in degrees. In Table 1, the parameter "angle max" is a maximum reflection angle of radiation to be reflected by the foils 4, in the respective design. The parameter "angle min" is a smallest reflection angle of reflection of the radiation to be reflected by the foils 4. The parameter "avg angle" is the average reflection angle of reflection of the radiation to be reflected by the foils 4. The parameter "max angle" is a maximum collection angle of the contaminant barrier. The parameter "foil distance" is the distance between the contaminant barrier foil(s) and the source.

TABLE 1

Expected values for some contaminant barrier designs

| foil length (m) | foil distance (m) | source pos (m) | # of foils | angle max | angle min | avg angle | max angle |
|---|---|---|---|---|---|---|---|
| 0.18 | 0.3 | −0.05 | 19 | 11 | 2.6 | 7 | 70 |
| 0.18 | 0.3 | −0.02 | 44 | 5.39 | 1.05 | 3.37 | 70 |
| 0.18 | 0.3 | −0.01 | 84 | 2.8 | 0.53 | 1.79 | 70 |
| 0.18 | 0.3 | −0.005 | 161 | 1.43 | 0.26 | 0.93 | 70 |
| 0.18 | 0.3 | −0.01 | 84 | 2.8 | 0.53 | 1.79 | 70 |
| 0.09 | 0.3 | −0.01 | 134 | 3.08 | 0.58 | 1.96 | 70 |
| 0.18 | 0.3 | −0.01 | 84 | 2.8 | 0.53 | 1.79 | 70 |
| 0.18 | 0.2 | −0.01 | 46 | 3.83 | 0.73 | 2.42 | 70 |
| 0.18 | 0.1 | −0.01 | 18 | 5.99 | 1.26 | 3.78 | 70 |
| 0.18 | 0.3 | −0.01 | 84 | 2.8 | 0.53 | 1.79 | 70 |
| 0.18 | 0.3 | −0.01 | 76 | 2.54 | 0.53 | 1.61 | 60 |
| 0.18 | 0.3 | −0.01 | 67 | 2.2 | 0.53 | 1.42 | 50 |

For example, according to a non-limiting embodiment, a maximum foil length can be about 50 cm, particularly 20 cm. A mentioned distance between the contaminant barrier 3 and the source SO can be in the range of about 0.1-1 m, for example in the range of about 0.1-0.3 m. A distance between the source SO and the apex T of the foils 4 can be in the range of about 0.1 cm-10 cm, for example a range of about 0.5-5 cm. A smallest reflection angle may be smaller than about 3 degrees, for example smaller than 2 degrees or 1 degree. Also, a maximum reflection angle (which is larger than the smallest reflection angle) may be at most 10 degrees, for example at most about 6. Desirably, the maximum reflection angle is at most equal to or smaller than a maximum angle to allow grazing incidence reflection, for the respective type of radiation to be reflected (for example EUV radiation). For example, a foil spacing can be in the range of 0.1-5 cm, for example about 1-20 mm, or can be smaller than about 10 mm. Moreover, depending on the design and application of the assembly, many other dimensions and angles can be applied, as will be appreciated by the skilled person. For example, FIG. 6 shows how the above-mentioned average reflection angle can increase with increasing the distance between the (focus) points F1 and F2.

FIGS. 7 to 9 relate to an advantageous embodiment wherein the contaminant barrier 3 is configured to reflect the radiation (emitted by the source SO) twice.

Particularly, as is shown in FIG. 7, the radiation source SO can be located in one (natural) focus point F1 (or F2) of the collector 1, and the contaminant barrier 3 can be arranged to provide an upstream reflection, to reflect radiation received from the source SO towards the collector 1 such that the collector 1 receives that radiation as appearing from a second (natural) focus point F2 (or F1 if the source is at F2) of the collector 1, and the contaminant barrier 3 can be arranged to provide a (second) downstream reflection, to reflect radiation received from the collector 1 towards the second focus point F2 (or F1 if the source is at F2). For example, the contaminant barrier 3 may contain reflecting surfaces 4a, 4b that extend along virtual conical planes, wherein apexes T of these virtual conical planes are located in or near the middle of the first and second focal points F1, F2, as shown in FIG. 7.

For example, as follows from FIG. 7, the reflecting elements 4 of the contaminant barrier 3 may be laid out such that radiation is reflected by the elements 4 twice, i.e. once before and once after being reflected by the collector 1. The position of the source SO with respect to the collector 1 can remain unchanged (compare with FIG. 2), which can provide several advantages. Moreover, this embodiment does not suffer much from spreading of the radiation from the radiation source.

Referring to FIG. 7, the apex T of the conical surfaces of the foils 4 can lie between the two focal points F1 and F2 of the concave mirror or collector 1. For example, this configuration may be conceived by drawing three radiation paths from F1 to F2 and subsequently drawing foils bisecting their intersections as shown in FIG. 7. As is mentioned above, radiation originating from one of the focal points, e.g. F1, is reflected by the contaminant barrier 3 such that it appears to originate from the other focal point F2. The collector 1 then reflects the radiation towards F1, after which it is reflected again by the contaminant barrier 3 towards F2. Thus, the radiation from F1 that would be focused in F2 without the contaminant barrier, is still focused to F2 with the contaminant barrier in place. The same holds when the radiation source SO is located at the other focal point (F2).

In the present embodiment, the length and spacing of the foils 4 is desirably chosen such that the contaminant barrier 3 is optically closed as seen from both focal points F1 and F2. As in the previous embodiment of FIG. 4, an optically closed configuration will generally not be possible for positions close to the optical axis, because the incident and reflected radiation paths overlap, but this is not a relevant problem if the collector 1 is replaced by a Schwarzschild collector, as mentioned before.

In the embodiment of FIG. 7, the reflective elements 4 are reflective on both (opposite) sides. According to an embodiment, it may be preferred to use a high-reflectivity grazing incidence coating on non-exposed sides 4b of the foils 4, particularly in the case that debris originating in a direct path from the source SO coats the other sides 4a of the foils 4.

A placement of the foils of the FIG. 7 embodiment may be found by the following steps 1-7. See FIG. 8 for a specific explanation of these steps:

1) Choose a collection angle, a (starting) foil length and a contaminant barrier distance;

2) Place the first foil 4(1) by drawing two lines originating from the points F1 and F2 with the desired collection angle, and drawing a first foil 4(1) with the chosen foil length, bisecting the intersection of these two lines;

3) Next, draw a line A1 from point F2 to the end of the previous foil 4(1). Find the intersection between the line A1 and a circle with the specified contaminant barrier distance as radius. This is the first point a of a next foil 4(2);

4) Draw two lines originating from F1 and F2 through the first point α. Draw a second line A2 through the first point α, bisecting the two lines from F1 and F2;

5) Draw a line third A3 between F1 and the front of the previous foil 4(1). The intersection of line A3 and line A2 gives a second point β;

6) The next foil 4(2) extends between the first and second points α, β; and

7) Draw subsequent foils by repeat the previous steps 3 to 6.

FIG. 9 shows a result an example of an optimum positioning of the foils 4 in a double-reflective embodiment. In this example, optimized foil positions for a double reflective contaminant barrier may be provided using the following parameters: source position=−0.05 m, a maximum collection angle=70°, a minimum collection angle=10°, foil thickness=100 μm, starting foil length=18 cm, and collector distance=50 cm.

Desirably, when designing the foils of the contaminant barrier 3 for the embodiment of FIGS. 7 to 9, the following effects may be taken into consideration:

Decreasing the distance between F1 and F2 can lead to increase of the number of foils and a decrease of the reflection angle;

Decreasing foil length can increase the number of foils (almost linearly), and can keep reflection angle roughly the same; thus, desirably the foils 4 are as long as possible;

Placing the contaminant barrier 3 nearer to the source SO can lead to decreasing losses due to the number of foils, and on the other hand can lead to increasing losses due to an increased reflection angle; and Increasing the maximum collection angle can give similar values for reflection angle and losses due to foils.

Table 2 shows expected values for some contaminant barrier design examples relating to the embodiments of FIGS. 7-9. Therein, the following parameters have been used: foil length=18 cm, foil thickness=100 μm, and collector distance=50 cm.

TABLE 2

Contaminant barrier design examples

| foil distance (m) | source pos (m) | # of foils | avg angle | max angle |
|---|---|---|---|---|
| 0.3 | 0.1 | 9 | 13.9 | 50 |
| 0.3 | 0.05 | 42 | 4.44 | 50 |
| 0.3 | 0.03 | 108 | 2.29 | 50 |
| 0.1 | 0.02 | 23 | 4.5 | 50 |
| 0.3 | 0.05 | 42 | 4.44 | 50 |
| 0.3 | 0.05 | 54 | 5.33 | 70 |

An advantage of the embodiments according to FIGS. 7 to 9 is that the respective dual-reflection configuration does not spread the etendue. The apparent shift introduced by the first reflection by the contaminant barrier 3 is compensated by a shift of the same magnitude but in opposite direction in the second reflection provided by the contaminant barrier 3, so that the radiation is properly focused. Particularly, the contaminant barrier 3 is designed such that the foils 4 are properly aligned to reflect radiation emanating from a focal point (F1, F2), and are also properly aligned to reflect radiation emanating from the collector 1 back to the same focal point (F1, F2), due to the double reflection.

Figure 11:
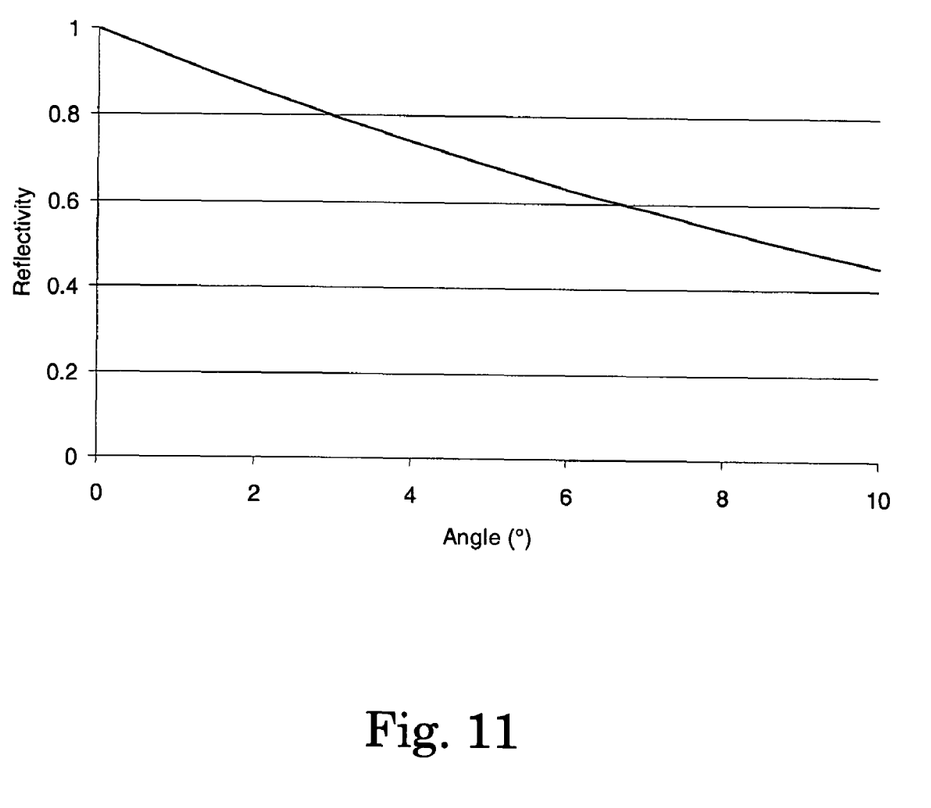
FIG. 11 is a graph showing a reflectivity versus average reflection angle of a liquid Sn mirror.

According to an embodiment, it is desirable to minimize the above-mentioned (average) reflection angles of the foils 4, e.g. by placing the foils 4 as far from the source SO as possible. Particularly, this follows from optical transmittance of embodiments of the invention, which can be determined by (i) front losses on edges of the foils 4 and (ii) reflection losses. The reflection losses can be estimated by evaluating the reflectivity curve of the foil surface at the reflection angles as given in Tables 1 and 2. FIG. 11 shows an example of the reflectivity relating to a liquid Sn mirror. Particularly, FIG. 11 depicts a calculated grazing-incidence reflectivity for a liquid Sn mirror, for the case that the contaminant barrier 3 is provided with liquid Sn mirror surfaces (see below). The reflection losses can be much more significant than the front losses on the edges of the foils.

According to an embodiment, an above-described contaminant barrier 3 may be operated at a temperature above the melting point of certain materials to be trapped or absorbed thereby, in particular, for tin (Sn), for example above a temperature of about 230° C. Such operation can result in smooth radiation reflection surfaces 4a of tin fluid on the foils 4, and can significantly increase the reflectivity for the radiation (for example EUV radiation). In addition, incoming debris may be absorbed in the liquefied surface 4a, which can provide "self healing" of the surface. For example, the contaminant barrier 3 may be arranged to heat up, in operation, due to the inherent energy absorption of the radiation source. In addition, additional heating elements (not shown) may be provided in or on the contaminant barrier 3. Such heating elements may be a thermo-absorbing coating or active elements, such as electrical heating circuits, etc.

As follows from the above, one or more embodiments of the present invention may provide an advantageous design for a contaminant barrier, particularly for use in combination with a normal-incidence EUV collector. The contaminant barrier 3 can be configured to capture various types of debris. For example, practical EUV sources can generate out-of-band radiation and debris, the latter of which severely limits the operational lifetime of the reflective collector optics close to the source. In the case of Sn-based sources, three types of debris can be distinguished:

slow atomic debris: thermalized atoms, i.e. with random direction and velocity according to the Maxwell distribution;

fast atomic debris: ions, neutrals and nanoclusters with a high ballistic velocity parallel to the optical path; and microparticles: micrometer-sized ballistic particles and droplets, also directed parallel to the optical path.

An embodiment of the present invention is to combine a normal-incidence collector, or more generally a normal-incidence reflector, with a reflecting contaminant barrier such that the radiation generally passes through the contaminant barrier twice, and particularly in different directions (see FIGS. 4-9). In an advantageous embodiment, the reflecting elements 4 of the contaminant barrier 3 can be laid out in such a way that a collector 1 can properly focus the radiation.

Moreover, an embodiment of the invention provides a reflective contaminant barrier for a normal-incidence collector, wherein the contaminant barrier 3 can be arranged between the source and the collector. According to an embodiment, the contaminant barrier may typically comprise a set of closely spaced platelets (foils, or concentric rings) in a configuration that is optically closed as seen from the source SO. All radiation going from the source SO to the collector (or other type of reflector) is reflected at least once from the surface of contaminant barrier 3. To this end, the contaminant barrier surface(s) 4a may be covered with e.g. liquid Sn, in which all debris is captured while maintaining a high reflectivity.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows; may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An assembly comprising:
   a radiation reflector; and
   a contaminant barrier,
   wherein the contaminant barrier is arranged to receive radiation from a radiation source and to reflect that radiation towards the radiation reflector, and
   the radiation reflector is arranged to reflect the radiation, received from the contaminant barrier, back towards the contaminant barrier.

2. The assembly according to claim 1, wherein the radiation reflector is a normal incidence radiation collector.

3. The assembly according to claim 1, wherein the contaminant barrier is arranged to optically block all lines of sight between a reflecting surface of the radiation reflector and the radiation source.

4. The assembly according to claim 1, configured such that radiation, emanating from the radiation source, passes the contaminant barrier twice, and is reflected by the contaminant barrier at least once.

5. The assembly according to claim 1, wherein the contaminant barrier comprises a plurality of radiation reflecting elements, each of the radiation reflecting elements extending along a respective virtual conical plane having an apex that substantially coincides with an optical axis of the assembly.

6. The assembly according to claim 1, wherein:
   the contaminant barrier is configured to change divergence of diverging radiation emitted from the radiation source, and
   the radiation reflector is arranged to reflect that diverging radiation to provide converging radiation.

7. The assembly according to claim 1, wherein the radiation reflector is arranged to focus the radiation onto a focus point on an optical axis, wherein the focus point is located between the source and the radiation reflector.

8. The assembly according to claim 1, wherein the radiation reflector is:
   a collector having a single substantially ellipsoid radiation collecting surface section; or
   a Schwarzschild collector having two radiation collecting surfaces.

9. The assembly according to claim 8, comprising the radiation source spaced-apart from a focus point of the collector, and wherein the contaminant barrier is arranged to reflect radiation received from the radiation source towards the collector such that the collector receives the radiation as appearing from the focus point.

10. The assembly according to claim 8, comprising the radiation source located at a first focus point of the collector, and wherein the contaminant barrier is arranged to provide an upstream reflection, to reflect radiation received from the radiation source towards the collector such that the collector receives that radiation as appearing from a second focus point of the collector, and the contaminant barrier is arranged to provide a downstream reflection, to reflect radiation received from the collector towards the second focus point.

11. The assembly according to claim 10, wherein the contaminant barrier comprises reflecting surfaces that extend along virtual conical planes, wherein apexes of these virtual conical planes are located in or near the middle between the first and second focus points.

12. The assembly according to claim 1, wherein the contaminant barrier comprises a plurality of radiation reflecting elements, each of the radiation reflecting elements comprising a reflecting surface to reflect the radiation.

13. The assembly according to claim 1, wherein the contaminant barrier comprises an array of radiation reflecting elements spaced-apart from each other by an intermediate spacing, wherein the intermediate spacing increases for each subsequent pair of adjoining radiation reflecting elements, viewed radially outwardly from an optical axis of the assembly.

14. The assembly according to claim 1, wherein the contaminant barrier defines radiation transmission channels, each radiation transmission channel extending along a virtual transmission direction that includes an angle with a radiation reflection surface of the radiation reflector of more than 45°.

15. The assembly according to claim 1, comprising the radiation source, the radiation source configured to emit the radiation.

16. A lithographic projection apparatus comprising
   a radiation reflector; and
   a contaminant barrier; and
   a projection system configured to project a patterned radiation beam onto a target portion of a substrate,
   wherein the contaminant barrier is arranged to receive radiation from a radiation source and to reflect that radiation towards the radiation reflector, and
   the radiation reflector is arranged to reflect the radiation, received from the contaminant barrier, back towards the contaminant barrier.

* * * * *